VOLTAGE CONTROLLED OSCILLATOR HAVING FORWARD BIASED DIODE

Original Filed July 6, 1964

INVENTORS:
ROBERT N. DOBLE
ROBERT JAMES MILLER
BY Edward A. Robinson
ATTORNEY

United States Patent Office 3,316,498
Patented Apr. 25, 1967

3,316,498

VOLTAGE CONTROLLED OSCILLATOR HAVING FORWARD BIASED DIODE

Robert N. Doble, Palo Alto, and Robert James Miller, San Bruno, Calif., assignors to General Precision, Inc., Binghamton, N.Y., a corporation of Delaware Continuation of application Ser. No. 380,534, July 6, 1964. This application July 8, 1966, Ser. No. 563,920
5 Claims. (Cl. 331—30)

This application is a continuation of Ser. No. 380,534, filed July 6, 1964, now abandoned.

This invention relates to oscillator circuits for generating output frequencies in accordance with an input control signal; and more particularly, this invention relates to a voltage controlled oscillator for use in an inductive loop vehicle detector system.

Inductive loop vehicle detecting systems have been disclosed and claimed in a co-pending patent application, Ser. No. 95,236 entitled, "Inductive Loop Presence Detector," filed by Robert A. Kleist and John Scarbrough on Mar. 13, 1961, now Patent No. 3,164,802, and by a further co-pending patent application, Ser. No. 172,620 entitled "Inductive Loop Vehicle Presence Detector" filed Feb. 12, 1962, by Martin John Prucha. These applications disclose arrangement for sensing vehicles wherein inductive loops are electrically connected as a part of an oscillating circuit such that the inductive value of the loop will control the frequency of oscillation. The output signal from the loop oscillator is fed to a mixer circuit together with a further signal generated by a reference oscillator to obtain a difference frequency. When a vehicle moves into the magnetic field of the loop, the inductance value thereof varies to shift the frequency of the loop oscillator. Although the frequency shift of the loop oscillator will be a relatively small value as compared to the normal oscillator frequency, the difference frequency generated by the mixer will vary considerably as compared with the normal difference frequency. Such a widely varying difference frequency may be easily detected by inexpensive output circuitry which may operate relay switching or the like.

The presence detector systems of these co-pending patent applications are subject to some instability due to inherent drift of the oscillators and particularly due to drift of the loop oscillator. It has been found that the loop oscillator circuitry including an inductive loop which may be embedded in the paving of a street will be subject frequency drift due to weather changes which will particularly affect the loop which is exposed to weather. Variations in temperature, and/or in the moisture content of the ground and street paving due to rain, or snow will vary the inductive characteristics of the loop and cause drift of the loop oscillator.

A further co-pending patent application, Ser. No. 380,559, entitled, "Inductive Loop Vehicle Detector," filed July 6, 1964 by Robert Newton Doble, Robert James Miller and Lawrence Sepe discloses an improved vehicle presence detector system using a loop oscillator together with the voltage controlled oscillator of this invention. As in the prior patent applications of Kleist et al. and Prucha, supra, two oscillator signals are combined in a mixer circuit to obtain a difference signal. However, in this case, the difference signal is passed to a discriminator circuit which generates a voltage level corresponding to the frequency of the difference signal. The control voltage from the discriminator is thence passed to the oscillator of this invention to control the frequency in accordance with the frequency of the loop oscillator. Thus, a gradual drift of the loop oscillator is compensated for by providing automatic frequency control, AFC, of the second oscillator to maintain a constant difference frequency. The AFC circuit of the discriminator may operate with a long time constant, such that an abrupt change of the difference frequency (which may be caused by a vehicle moving over the loop), will not cause an immediate change in the control voltage. This discriminator circuit is fully disclosed in a further co-pending application 377,550, entitled "Frequency Discriminator" filed June 24, 1964 by the inventors of the instant application.

It is an object of this invention to provide an improved vehicle presence detector system including an oscillator circuit that is simple and economical to manufacture, and that will provide an output signal having a frequency that is determined by an input control signal.

It is a further object of this invention to provide an improved vehicle presence detector system including an oscillator including a resonant circuit which is tunable by an impressed control voltage whereby the frequency of the oscillator output signal is controlled by an input signal.

Another object of this invention is to provide an oscillator, the frequency of which is controlled by a resonant circuit including both a variable element for a coarse manual tuning and a diode arrangement for a fine tuning controllable from an input voltage of an AFC circuit.

Numerous other objects and advantages will be apparent throughout the progress of the specification which follows. The accompanying drawing illustrates a certain exemplary embodiment of the invention and the views therein are as follows.

Figure 1:
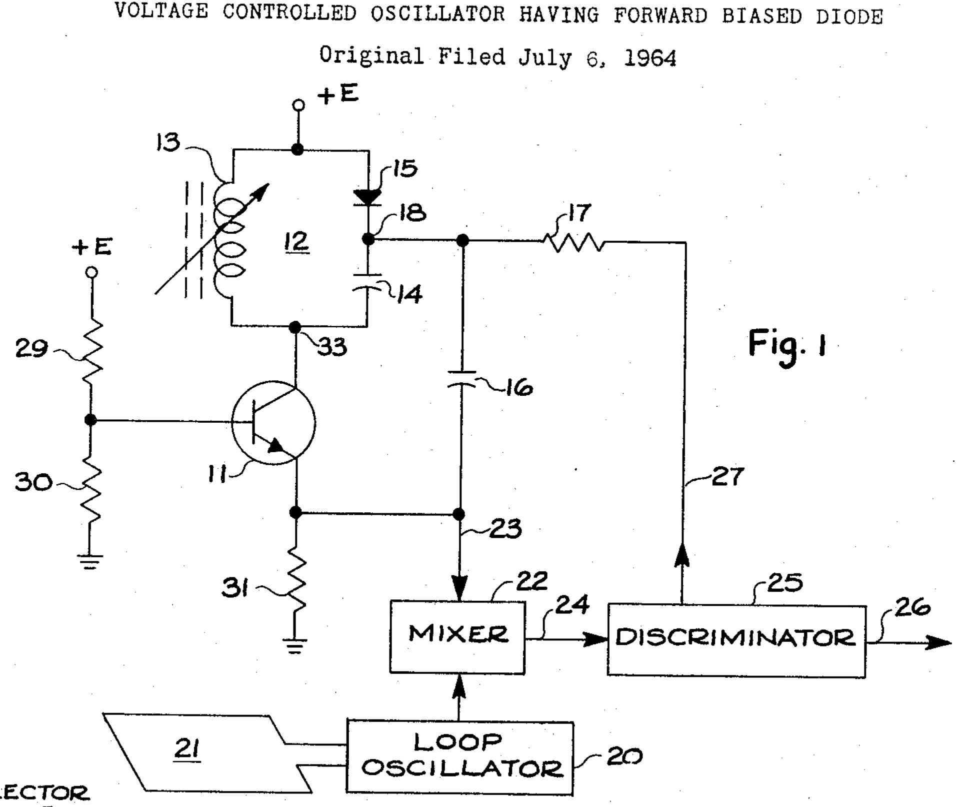
FIGURE 1 is a circuit diagram of the oscillator of this invention and further including certain component circuits of a portion of the vehicle presence detector system in which this oscillator may be used.

Briefly stated, according to a preferred embodiment of this invention a vehicle presence detector system, an oscillator circuit includes a transistor 11 and a tuned circuit 12. The tuned circuit 12 comprises a variable inductance element 13, a capacitor 14 and a diode 15. The capacitor 14 and diode 15 are connected in series and are coupled between the collector electrode of the transistor 11 and a power supply reference potential +E. The inductive element 13 is connected in parallel with the serially connected capacitor 14 and diode 15 and is likewise coupled between the collector electrode of the transistor 11 and the source of reference potential. A capacitor 16 provides a positive feedback path between the tuned circuit 12 coupled to the collector of the transistor 11 and the emitter circuit thereof. A control voltage is passed by a resistor 17 to the serial connection point 18 between the capacitor 14 and the diode 15. The control voltage provides a bias to the diode 15 to control conduction therein. The frequency of oscillation is determined by the biasing level of the control voltage which effectively establishes a cut off point for the diode 15.

As indicated above, the voltage controlled oscillator of this invention may be used in a vehicle presence detector system. Such a system will include an oscillator 20 having an inductive loop 21 which may be embedded in the paving of a traffic lane of a highway or may be positioned beneath the rails of a railroad track. The frequency of the loop oscillator 20 is controlled by the inductance value of the loop 21 which is subject to change when the metallic mass of a vehicle moves thereover. A mixer circuit 22 receives signals from the loop oscillator 20 and from the voltage controlled of this invention via an output lead 23.

In a preferred form of a vehicle presence detector circuit, the loop oscillator may generate a signal of approximately 91 kilocycles, and the voltage controlled oscillator may pass signals via lead 23 of approximately 90 kilocycles. The mixer circuit 22 will therefore generate a difference frequency of approximately 1,000 cycles on a lead 24 under normal operating conditions. In accordance with the teachings of the co-pending patent application, Ser. No. 380,559, supra, a filter means is associated with the mixer and the discriminator circuits for suppressing the higher frequencies and for passing only the difference frequency. The discriminator circuit 25 which may be constructed in accordance with the co-pending patent application, 377,550, supra, will provide an output switching signal on a lead 26 for operation of relays and load devices (not shown), and will further provide a control voltage on a lead 27 which will vary in accordance with the frequency of the difference signal appearing on the lead 24. The resistor 17 passes the control voltage to establish a bias at the point 18 for controlling the frequency of the oscillator of this invention.

In the oscillator circuit, a pair of resistors 29 and 30 are connected in series between a positive reference potential +E and ground reference potential to provide a bias voltage at the base electrode of the transistor 11. The emitter electrode of the transistor 11 is coupled to ground via a resistor 31 as indicated above. The collector electrode of the transistor 11 is coupled to a positive reference potential +E via the resonant circuit 12. This circuit may be likened to a Colpitts oscillator wherein the resonant frequency of the circuit 12 will determine the frequency of oscillation. This circuit has been constructed and has proved to be an effective voltage controlled oscillator capable of varying in output frequency in accordance with an input voltage applied to the point 18 via the resistor 17.

Voltage controlled oscillators have been known wherein a varactor diode is coupled in parallel with the frequency determining elements of the circuit. Then, by varying the reverse D.C. bias applied to the varactor, the frequency of oscillations is correspondingly varied, since the reversed biased varactor diode operates as a voltage-variable capacitor. However, the capacitance of such varactors is extremely small, being within the range of 3 to 10 $\mu\mu$f., and for this reason the L to C ratio of the resonant circuit must be maintained extremely high, in order that the controlled capacitance change of the varactor may determine the frequency of oscillations, that is, the capacitance of the resonant circuit itself must at least be equal to or less than the value of capacitance exhibited by the varactor. Such oscillators, wherein the L to C ratio is maintained extremely high, are relatively unstable, while additionally generating a large amount of noise. Further, since the capacitance variation provided by the varactor is limited, the tuning range of the oscillator is likewise limited.

The circuit illustrated in FIGURE 1, however, has been built and proved to be a very stable and noise free oscillator, the frequency of which is voltage-controlled over an extended frequency range. Additionally, rather than connecting conventional semi-conductor diode 15 in parallel with the frequency determining resonant circuit 12 of the oscillator, diode 15 is connected in *series* with the capacitive branch of the tank circuit. In this manner, capacitor 14, which determines the resonant frequency of the tank circuit, is also effective to prohibit the D.C. collector potential from being applied to diode 15, while allowing the A.C. collector potential to be coupled thereto. Further, diode 15, under static D.C. conditions, is biased for *forward* conduction, and this novel condition is believed to provide the extended voltage-controlled frequency range in a completely unsuspected manner, as more particularly hereinafter described.

Figures 3A, 3B, 4A, 4B:
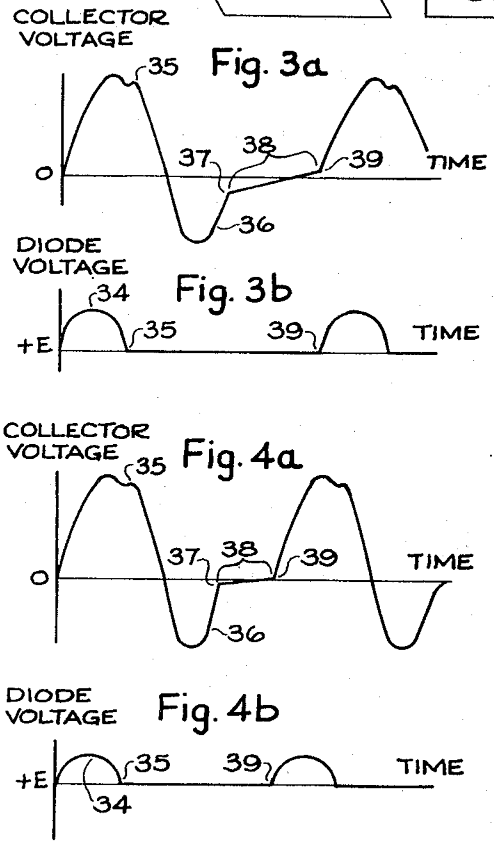
FIGURES 3*a*, 3*b*, 4*a* and 4*b* are curves illustrating the voltage waveforms at points in this circuit.

From a cursory glance at this circuit, it might be surmised that resonant circuit 12 would have a first resonant frequency, determined solely by the relative values of the inductance of coil 13 and the capacitance of capacitor 14, when diode 15 is conductive, and a second resonant frequency determined primarily by the relative values of the inductance of coil 13 and the capacitance of reversed biased diode 15, when diode 15 is non-conductive. Under these assumed conditions, the frequency of the output signal would be determined by the time duration of the interval of diode conduction as compared with the interval of diode non-conduction within each cycle. But such a dual resonant frequency theory is not supported by the waveshapes experimentally observed at junction 18 and the collector of transistor 11, by way of example, which are reproduced herein as FIGURES 3*a*, 3*b*, 4*a* and 4*b*, wherein FIGURES 3*a* and 4*a* illustrate the waveshapes generated between the collector and ground, and FIGURES 3*b* and 4*b* illustrate the waveshapes generated between junction 18 and ground. Although it might appear that the waveform provided by the oscillator of the present invention is highly distorted, it will be understood by those skilled in the art, that the fundamental frequency may be readily filtered, if desired, since the waveform includes only odd harmonics, and thus the nearest harmonic, the third, is two octaves removed from the fundamental, and, also, its amplitude is very much less than the amplitude of the fundamental.

Although the theory of oscillation of the extended frequency range, voltage-controlled oscillator of the present invention is not completely understood at present, the following possible explanation is next described in order to explain the observed results, it being understood that other and different explanations may, perhaps, be more correct. Initially, when positive supply potential +E is first applied to transistor 11, the transistor conducts, thereby lowering the potential of its collector and charging capacitor 14 through a path defined by forward biased diode 15 and coil 14. A portion of this potential drop is coupled by capacitor 16 to the emitter of transistor 11, and drives the transistor further into conduction. This regenerative action continues until transistor 11 is completely saturated and its collector potential has decreased to its maximum possible excursion. At this time, capacitor 14 is fully charged and the regenerative action ceases.

However, capacitor 14 now attempts to discharge, but the conventional discharge path through coil 13 is prevented by diode 15 which is unable to conduct *reverse* current since it is *forward* biased at this time. Therefore, and this is an important feature of the invention, capacitor 14 begins to discharge through transistor 11 and feedback capacitor 16, in a manner completely different from other known oscillators, and coil 13 is not utilized in the discharge path at this time at all. However, during this discharge portion of the cycle, the effective potential of the emitter of transistor is rising, and finally a point is reached, indicated as 37 in FIGURE 3*a*, at which transistor 11 is cut off. Now, since capacitor 14 has not been discharged completely, the capacitor continues to discharge through an alternate path consisting primarily of coil 13, resistor 31 and feedback capacitor 16, the impedance provided by discriminator 25 being sufficiently high so as to be neglected in this discussion. Since coil 13 is now included in the discharge path, a portion of the stored energy provided from capacitor 14 remains in the tank circuit. The discharge of capacitor 14 through the RC network provided by resistor 31 and capacitor 16 provides the typical ramp function indicated as 38 in FIGURE 3*a*. However, this ramp voltage is in opposition to the *forward* bias provided throught resistor 17, and at a potential determined by the forward bias applied, diode 15 becomes *reverse* biased. Now at this time, diode 15 is available to conduct *reverse* current, and capacitor 14 completes its discharge cycle through coil 13 and reverse biased diode 15 in the conventional manner. Finally, all the energy remaining in the tank circuit is stored in coil 13 and capacitor 14 is discharged.

Next, the energy stored in coil 13 begins to transfer to capacitor 14 through normal tank circuit action decreasing the voltage observed at the collector of transistor 11. This decrease allows diode 15 to once again conduct as shown in FIGURE 3*b*, and, further, by means of the positive feedback provided by capacitor 16, transistor 11 also is switched to the conduction state. The regenerative action then continues, and the cycle repeats as above described. Note should be made of the fact that, although the oscillator of the invention operates to charge the capacitive branch of the resonant circuit through the inductive branch in the normal manner, a number of independent discharge paths are employed in sequence. First, the capacitive branch discharges through the energy supplying device, this initial discharge thereafter rendering the energy supplying device inoperative. Second, the capacitive branch next discharges through a resistance-capacitance network which generates a voltage to *reverse* bias a normally *forward* biased diode connected in series with the capacitive branch. And, third, the capacitor completes its discharge through the inductive branch by means of a *reverse current* through the now *reverse* biased diode. It is also important to note that the peak-to-peak amplitude of the collector waveform shown in FIGURE 3*a* is 50 volts or more, since the oscillator is not readily adaptable to generate small amplitude signals without the use of an external attenuator.

An extremely important feature of the invention is that the time duration of ramp 38, and thus the fundamental frequency of oscillation, is variable over wide limits under control of a relatively small D.C. control signal. This result is achieved since the end of the ramp occurs when it achieves a sufficiently positive potential to reverse bias diode 15, and, since the ramp exhibits only a relatively small slope, it takes a relatively long time to traverse each unit volt. Thus, as the control voltage provided through resistor 17 increases the forward bias applied to diode 15, the ramp time correspondingly increases, thereby increasing the oscillation period and decreasing the frequency of the output signal. Alternatively, as the forward bias decreases, the ramp time also decreases, as shown in FIGURE 4*b*, thereby increasing the frequency of the output signal. Of course, if diode 15 is reverse biased under static conditions, no ramp function is generated, since diode 15 is immediately available to conduct a reverse current at the time transistor 11 is cut off.

By way of illustration only, and not by way of limitation, the following specific circuit values are listed for an oscillator according to the invention which provides output signals in the range between 60 and 150 kc. as the *forward* bias across diode 15 varied between 5 and 0 volts:

| | | |
|---|---|---|
| Resistor **17** | ohms | 27K |
| Resistor **29** | do | 10K |
| Resistor **30** | do | 10K |
| Resistor **31** | do | 10K |
| Coil **13** | mh | 4–30 |
| Capacitor **14** | $\mu\mu$f | 250 |
| Capacitor **16** | $\mu$f | 0.01 |
| Transistor **11** | Type | S7304 |
| Diode **15** | Type | CER68 |
| Reference voltage +E | volts | +30 |

Figure 2:
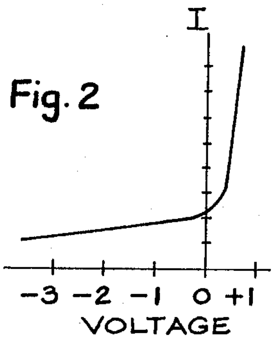
FIGURE 2 is a graphical representation of the conduction characteristics of a diode which may be included as an element of the tuned circuit incorporated in the oscillator of this invention.

The conduction characteristic of a practical diode is shown by FIGURE 2 wherein the diode is non-conductive when negatively biased, but breaks into heavy conduction when the bias becomes positive by a value of .5 to 1 volt. FIGURE 2 represents the characteristic of a typical diode. Some diodes provide a characteristic that approach the "ideal diode" characteristic wherein the knee of the curve is very sharp, and the transistion between the non-conducting state and the conducting state is very abrupt. Such a diode has been found to be most desirable for use as the element 15 of the tuned circuit 12. Other diodes having inferior characteristics such that the transistion between the conduction and non-conduction is more gradual have been found to be less desirable in the oscillator circuit of this invention.

When a vehicle presence detector system is initially installed to monitor the movement of vehicular traffic along a highway traffic lane or railroad track, the loop oscillator 20 is connected to a previously installed loop 21. The inductive value of an installed loop may not be accurately determined prior to installation. The physical dimensions of various loops are different; the number of turns may vary from one installation to another; and the character of the street paving or underlying soil may be different from one location to another. When a loop is installed in concrete paving, it is likely that a grid or mesh of reinforcing steel will underly the loop and will greatly affect the loop characteristics. Further unpredictable conditions may exist at any loop location. Since the connection to the loop must be made in the field, it is not possible to tune the loop oscillator 20 at the factory. After field installation, a loop oscillator will oscillate at a frequency in a range between approximately 85 kilocycles to 200. To insure proper operation of the vehicle presence detector system, the voltage controlled oscillator of this invention is first manually tuned by adjusting the inductor 13. This manual step comprises a coarse tuning adjustment to establish the frequency of the output signal on the lead 23 at a value approximately 1,000 cycles less than the frequency of the loop oscillator 20. After this coarse tuning adjustment has been made, the AFC of the presence detector system will hold the voltage controlled oscillator of this invention at a proper value with respect to the output signal of the loop oscillator 20. The AFC arrangement comprises the discriminator 25 which furnishes the control voltage passed by the resistor 17 to control the tuned circuit 12. After the system is placed in operation any gradual drift of the loop oscillator frequency due to environmental changes will be compensated for via the AFC loop which causes the second oscillator to assume a proper frequency with respect to the first oscillator. By varying the control voltage to the oscillator of this invention, the frequency of oscillation may be varied over a range of approximately 5 kilocycles. This range of AFC tuning has been found to be more than sufficient to compensate for the drift of a loop oscillator during normal operation. Therefore, it may be appreciated that in an initial tuning of the inductor 13, the frequency of oscillation of this oscillator may be varied over a range of more than 100 kilocycles, and that once tuned, the AFC operation will maintain the difference frequency at a correct value even though the loop oscillator drifts as much as 5 kilocycles.

The output signal is generated at the emitter electrode of the transistor 11 and appears on the output lead 23. The waveform of the output signal is very similar to the waveform of the diode voltage shown in FIGURES 3*b* and 4*b*. Obviously, the output waveform departs considerably from a sine wave. However, the mixer circuit 22 has associated therewith a low pass filter arrangement such that only the fundamental frequency is used. Therefore, the irregularity of the output waveform is not detrimental to the presence detector circuit in which the oscillator circuit may be used. If this oscillator is used in other applications where a sine wave or a square wave output is needed, a filter and buffer amplifying stage may be added without departing from the spirit of this invention. Such a buffer amplifying stage could be operated class A to provide a sine wave output, or it could be driven to saturation to provide a square wave output.

Apparatus in accordance with this invention has been constructed and tested and has proved to be more reliable than the previous presence detector systems which relied upon oscillator stability to generate a difference frequency which will remain within the useful range of the equipment. A vehicle presence detector using the voltage controllable second oscillator of this invention has proved more reliable than prior systems because considerable drift of the loop oscillator may be tolerated without adverse effect. Should the loop oscillator drift from its normal frequency, the voltage controlled oscillator will shift corresponding in frequency to maintain the difference frequency output from the mixer substantially constant.

Changes may be made in the form, construction and arrangement of the parts without departing from the spirit of the invention or sacrificing any of its advantages, and the right is hereby reserved to make all such changes as fall fairly within the scope of the following claims.

The invention is claimed as follows:

1. A voltage-controlled oscillator comprising a transistor having at least an emitter electrode and a collector electrode, a tunable circuit including a variable inductive element, a capacitive element and a diode, said inductive element being connected between the collector electrode of the transistor and a source of reference potential, said capacitor and said diode being connected in series at a point providing an input coupling terminal for a control voltage, said serially connected diode and capacitor being coupled in parallel with the variable inductor and being connected between the collector electrode of the transistor and the reference potential, to provide a forward bias to cause current flow therethrough during a part of each cycle of oscillation, and a second capacitor coupled between the emitter electrode of the transistor and the input coupling point of the tunable circuit and operative to provide a positive feedback path between the tuned circuit and the transistor.

2. A vehicle presence detector system comprising a voltage-controlled oscillator for generating a signal of a first frequency, a loop oscillator having an inductive loop coupled thereto for generating a second signal having a frequency determined by the inductive loop, a mixer circuit coupled to both oscillators for generating a third signal having a frequency equal to the difference in the frequencies of the oscillator signals, and a discriminator circuit for generating a control voltage corresponding to the difference frequency of the third signal, said voltage-controlled oscillator comprising a controllable conduction device for generating an output signal, a voltage supply, a tuned circuit coupled between the controllable conduction device and the voltage supply for establishing a frequency for the output signal, a feedback means coupled to the tuned circuit and to the controllable conduction device, and a coupling means for passing the control voltage from the discriminator circuit to the tuned circuit, said tuned circuit including an inductive element, a capacitive element, and a diode, said capacitive element and said diode being connected in series and said inductive element being connected in parallel with the serially connected capacitive element and diode, said coupling means being coupled to the serial connection between the capacitive element and the diode, said voltage supply being connected to forward bias the diode into conduction.

3. A vehicle presence detector system comprising a voltage-controlled oscillator for generating a signal of a first frequency, a loop oscillator having an inductive loop coupled thereto for generating a second signal having a frequency determined by the inductive loop, a mixer circuit coupled to both oscillators for generating a third signal having a frequency equal to the difference in the frequencies of the oscillator signals, and a discriminator circuit for generating a control voltage corresponding to the difference frequency of the third signal, said voltage-controlled oscillator comprising a transistor for generating an output signal, a voltage supply, a tunable circuit coupled between the transistor and the voltage supply for establishing a frequency for the output signal, a feedback means coupled to the tuned circuit and to the transistor, and coupling means for passing the control signal from the discriminator circuit to the tunable circuit, said tunable circuit including an inductive element, a capacitive element, and a diode, said capacitive element and said diode being connected in series with each other, and said inductive element being connected in parallel with the serially connected capacitive element and diode, said coupling means being coupled to the series connection between the capacitive element and the diode, said voltage supply being coupled to provide a forward bias to the diode to cause current flow therethrough during at least a part of each cycle of oscillation.

4. A vehicle presence detector system in accordance with claim 3 wherein the inductive element comprises a variable inductor for providing a coarse manual tuning for the system, said coupling means between the discriminator circuit and the tunable circuit constituting a fine tuning arrangement to provide automatic frequency control for the system.

5. A vehicle presence detector system comprising a voltage-controlled oscillator for generating a signal of a first frequency, a loop oscillator having an inductive loop coupled thereto for generating a second signal having a frequency determined by the inductive loop, a mixer circuit coupled to both oscillators for generating a third signal having a frequency equal to the difference in the frequencies of the oscillator signals, and a discriminator circuit for generating a control voltage corresponding to the difference frequency of the third signal, said voltage-controlled oscillator comprising a transistor having at least an emitter electrode and a collector electrode, a voltage supply, a tunable circuit including a variable inductive element, a capacitive element and a diode, said inductive element being connected between the collector electrode of the transistor and the voltage supply, said capacitive element and said diode being connected in series at a point providing a coupling terminal, means for passing the control voltage from the discriminator circuit to the coupling terminal, said serially connected capacitive element and diode being coupled in parallel with the variable inductor and being connected between the collector electrode of the transistor and the voltage supply to provide a forward bias to cause current to flow through the diode during a part of each cycle of oscillation, and a second capacitive element coupled between the emitter electrode of the transistor and the coupling terminal for providing a positive feedback path between the tunable circuit and the transistor.

No references cited.

ROY LAKE, *Primary Examiner.*

J. KOMINSKI, *Assistant Examiner.*